United States Patent
Tung (10) Patent No.: US 8,599,633 B2
(45) Date of Patent: Dec. 3, 2013

(54) METHOD FOR REDUCING STANDBY CURRENT OF SEMICONDUCTOR MEMORY DEVICE

(75) Inventor: Ming-Sheng Tung, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 27 days.

(21) Appl. No.: 13/464,998

(22) Filed: May 6, 2012

(65) Prior Publication Data

US 2013/0294178 A1 Nov. 7, 2013

(51) Int. Cl.
*G11C 7/00* (2006.01)
(52) U.S. Cl.
USPC ............................. 365/203; 365/202; 365/204
(58) Field of Classification Search
USPC ........................................................ 365/203
See application file for complete search history.

(56) References Cited

U.S. PATENT DOCUMENTS

| | | | |
|---|---|---|---|
| 5,499,211 A | 3/1996 | Kirihata | |
| 5,995,431 A * | 11/1999 | Inui et al. | 365/203 |
| 7,414,896 B2 | 8/2008 | Oh | |
| 8,279,686 B2 * | 10/2012 | Hsu et al. | 365/189.11 |
| 2006/0087898 A1 * | 4/2006 | Xi et al. | 365/189.09 |

* cited by examiner

*Primary Examiner* — Son Mai
(74) *Attorney, Agent, or Firm* — Li & Cai Intellectual Property (USA) Office (57) ABSTRACT

A semiconductor memory device includes memory cells, a sensing amplifier, a precharge circuit, and a control signal generator. The precharge circuit has a NMOS transistor and two PMOS transistors, and is used to precharge bit lines of a bit line pair, wherein the NMOS transistor is controlled by a first control signal, and the two PMOS transistors are controlled by a second control signal. The control signal generator is used to generate the first and second control signals, wherein the first control signal is at a logic high level only when the second control signal is at a first logic low level, the first control signal is at a logic low level when the second control signal is at a second logic low or a first logic high level, and the second logic low level is higher than the first logic low level.

11 Claims, 6 Drawing Sheets

METHOD FOR REDUCING STANDBY CURRENT OF SEMICONDUCTOR MEMORY DEVICE

BACKGROUND

1. Technical Field

The present disclosure relates to a semiconductor memory device, in particular, to a method for reducing the standby current of the semiconductor memory device.

2. Description of Related Art

In the dynamic semiconductor memory device, for example, dynamic random access memory (DRAM), a bit line/word line short-circuiting defect, that is, a cross-fail defect, is liable to occur due to the microminiaturization and high integration density of elements. To overcome operation errors due to the cross-fail, the conventional semiconductor memory device may have a repairing circuit, that is, a redundancy circuit. The repairing circuit has the spare bit lines and word lines to replace the defective bit lines and word lines, and thus a yield rate of the semiconductor memory device can be improved.

Generally speaking, the repairing circuit has at least one redundant row of spare bit lines and at least one column of spare word lines, and thus the space of the semiconductor memory device is increased. Furthermore, though the cross-fail may be remedied by the repairing circuit, the defective word lines and bit lines associated with the cross-fail are still not electrically separated. Thus, when the semiconductor memory device operates in the standby mode, that is, at a precharging time, the cross-fail increases the standby current, causing a standby failure.

One approach to minimizing current flow due to the cross-fail is the use of a pulsed equalizer control while enabling the precharge equalizer signal. This scheme, however allows a floating state in each bit-line pair, causing a bit-line voltage drift in a long pause condition. To avoid this problem, a reference cell is provided for bit-line sensing. Such the reference cell, however, requires a complicated layout, difficult control, and a large active current dissipation.

Figure 1:
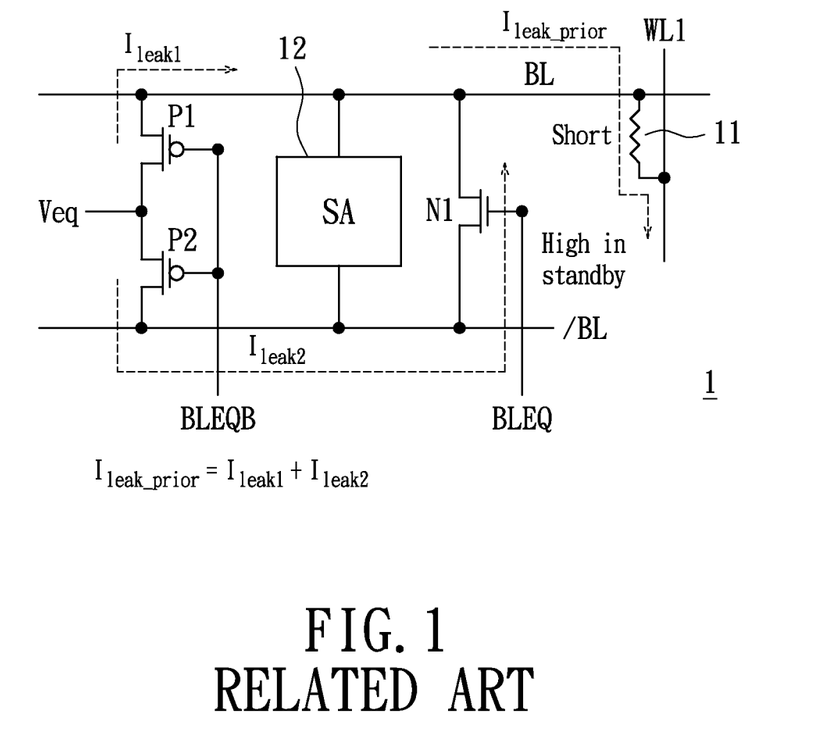
FIG. 1 is an equivalent circuit diagram showing a conventional semiconductor memory device which has a cross-fail.

Referring to FIG. 1, FIG. 1 is an equivalent circuit diagram showing a conventional semiconductor memory device which has a cross-fail. The semiconductor memory device 1 comprises at least a memory cell, a sensing amplifier 12, and a precharge circuit implemented by the PMOS transistors P1, P2, and the NMOS transistor N1. When the cross-fail occurs at the word line WL1 and the line BL, the bit line/word line short circuiting 11 can be modeled a resistor between the word line WL1 and the bit line BL.

In FIG. 1, a source and a drain of the NMOS transistor N1 are respectively coupled to the bit lines BL and /BL of the bit line pair, and a gate of the NMOS transistor receives a first control signal BLEQ. Two ends of the sensing amplifier 12 are coupled to the bit lines BL and /BL of the bit line pair. Two source of the PMOS transistors P1 and P2 are coupled to an equalizing voltage $V_{eq}$. Two drains of the PMOS transistors P1 and P2 are respectively coupled to the bit lines BL and /BL of the bit line pair. Two gates of the PMOS transistors P1 and P2 receive a second control signal BLEQB.

Figure 2:
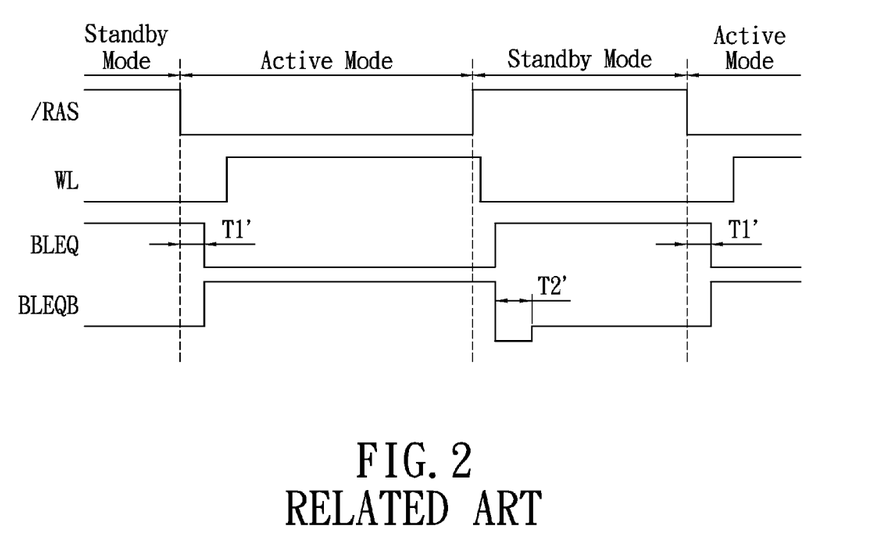
FIG. 2 is a waveform diagram of a row address strobe signal, a word line signal, a first control signal, and a second control signal in the conventional semiconductor memory device of FIG. 1.

Referring to FIG. 1 and FIG. 2, FIG. 2 is a waveform diagram of a row address strobe signal, a word line signal, a first control signal, and a second control signal in the conventional semiconductor memory device of FIG. 1. The row address strobe signal /RAS controls the semiconductor memory device 1 to operate in the standby mode or the active mode. The word line signal WL is used to select the corresponding word line, for example the word line WL1. The first and second control signals BLEQ and BLEQB are used to control the precharge circuit to precharge the bit lines BL and /BL of the bit line pair in the standby mode.

Firstly, the row address strobe signal /RAS is at a logic high level, thus the semiconductor memory device 1 operates in the standby mode, and the word line signal WL is at a logic low level. The first control signal BLEQ is at the logic high level, the second control signal BLEQB is at a second logic low level, and thus the PMOS transistors P1, P2 and the NMOS transistor N1 are turned on. Since the cross-fail occurs, leak currents $I_{leak1}$ and $I_{leak2}$ are aggregated to form a standby current $I_{leak\_prior}$ which passes through the bit line/word line short circuiting 11.

Then, the row address strobe signal /RAS changes from the logic high level to the logic low level, thus the semiconductor memory device 1 start to operate in the active mode. When the semiconductor memory device 1 start to operate in the active mode, the first and second control signals BLEQ and BLEQB respectively maintain the logic high and the second logic low levels for a period T1', wherein the period T1' is much shorter than the period of the active mode. After first and second control signals BLEQ and BLEQB have respectively maintained the logic high and the second logic low levels for the period T1', the first control signal BLEQ changes from the logic high level to the logic low level, and the second control signal BLEQB changes from the second logic low level to a first logic high level. After the first and second control signals BLEQ and BLEQB have been at the logic low and first logic high levels, the word line signal WL changes from the logic low level to the logic high level. It is noted that, the logic high level can be the first logic high level, the logic low level can be the first or second logic low level (the first logic low level is lower than the second logic level), and the present disclosure is not limited thereto.

Next, the row address strobe signal /RAS changes from the logic low level to the logic high level, and thus the semiconductor memory device 1 start to operate in the standby mode again. Before the first control signal BLEQ changes from the logic low level and the logic high level, and the second control signal BLEQB changes from the first logic high level to the second logic low level, the word line signal WL changes from the logic high level to the logic low level. After the word line signal has changed from the logic high level to the logic low level, the first control signal BLEQ changes from the logic low level to the logic low level, and the second control signal BLEQB changes from the first logic high level to the first logic low level. After the second control signal BLEQB has maintained the first logic low level for the transient period T2', the second control signal BLEQB changes from the first logic low level to the a second logic low level, and the first control signal BLEQ still maintains the logic high level, wherein the second logic low level higher than the first logic low level, and the transient period T2' is much shorter than the period of the standby mode. Thus, the PMOS transistors P1, P2, and the NMOS transistor N1 are still turned on. The second control signal BLEQB with the second logic low level is used to improve the precharge of the bit lines BL and /BL, and there is still the standby current $I_{leak\_prior}$ passing through the bit line/word line short circuiting 11.

Next, the row address strobe signal /RAS changes from the logic high level to the logic low level, and thus the semiconductor memory device 1 start to operate in the active mode again. When the semiconductor memory device 1 start to operate in the active mode again, the first and second control signals BLEQ and BLEQB respectively maintain the logic high and the second logic low levels for a period T1'. After first and second control signals BLEQ and BLEQB have respectively maintained the logic high and the second low levels for the period T1', the first control signal BLEQ changes from the logic high level to the logic low level, and the second control signal BLEQB changes from the second logic low level to the first logic high level.

SUMMARY

An exemplary embodiment of the present disclosure provides a method for reducing a standby current of a semiconductor memory device. The semiconductor memory device has a precharge circuit comprising a NMOS transistor and two PMOS transistors, wherein the NMOS transistor is controlled by a second control signal, the two PMOS transistors are controlled by a first control signal. The first control signal and the second control signal are respectively a logic low level and a second logic low level in a standby mode before the semiconductor memory device enters an active mode. The steps of the method are illustrated as follows. After the semiconductor memory device enters an active mode from the standby mode, the first control signal changes from the logic low level to a logic high level in the active mode, and the second control signal changes from the second logic low level to a first logic low level in the active mode, wherein the first logic low level is lower than the second logic low level. Before a word line signal changes from the logic low level to the logic high level in the active mode, the first control signal changes from the logic high level to the logic low level in the active mode, and the second control signal changes from the first logic low level to a first logic high level in the active mode.

An exemplary embodiment of the present disclosure provides a semiconductor memory device including memory cells, a sensing amplifier, a precharge circuit, and a control signal generator. The precharge circuit has a NMOS transistor and two PMOS transistors, and is used to precharge bit lines of a bit line pair, wherein the NMOS transistor is controlled by a first control signal, and the two PMOS transistors are controlled by a second control signal. The control signal generator is used to generate the first and second control signals, wherein the first control signal is at a logic high level only when the second control signal is at a first logic low level, the first control signal is at a logic low level when the second control signal is at a second logic low or a first logic high level, and the second logic low level is higher than the first logic low level.

To sum up, exemplary embodiments of the present disclosure provide a method for reducing the standby current of the semiconductor memory device and a semiconductor memory device thereof. In these exemplary embodiments, the standby current of the semiconductor memory device is smaller than that of the conventional semiconductor memory device.

In order to further understand the techniques, means and effects the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Wherever possible, the same reference numbers are used in the drawings and the description to refer to the same or like parts.

To reduce the standby current when the semiconductor memory device with a cross-fail operates in the standby mode, an exemplary embodiment of the present disclosure provides a semiconductor memory device having a control signal generator for controlling the precharge circuit thereof.

Figure 3:
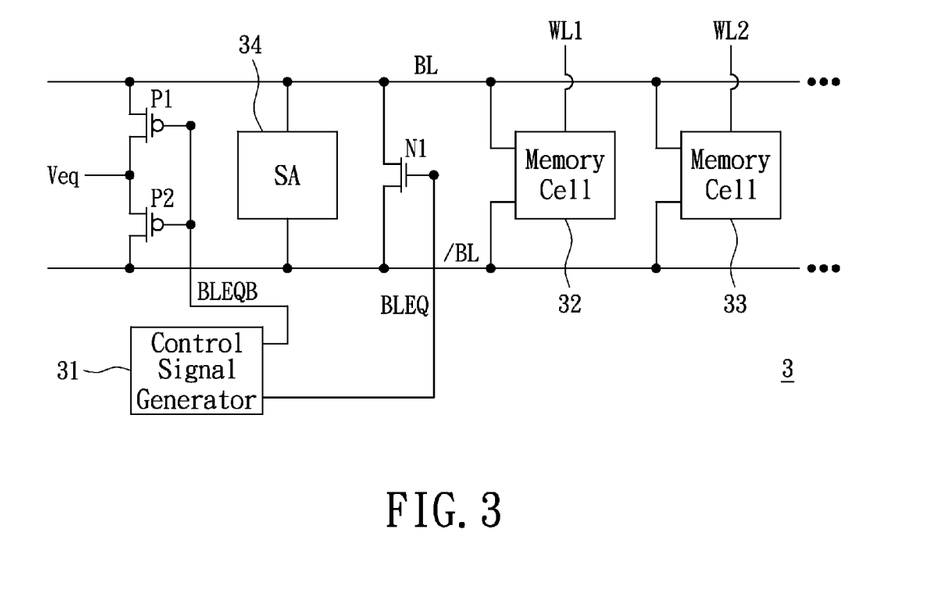
FIG. 3 is a circuit diagram of a semiconductor memory device according to an exemplary embodiment of the present disclosure.

Referring to FIG. 3, FIG. 3 is a circuit diagram of a semiconductor memory device according to an exemplary embodiment of the present disclosure. The semiconductor memory device 3 comprises a control signal generator 31, a plurality of memory cells 32, 33, a sensing amplifier 34, and a precharge circuit form by two PMOS transistors P1, P2, and a NMOS transistor N1.

In FIG. 3, a source and a drain of the NMOS transistor N1 are respectively coupled to the bit lines BL and /BL of the bit line pair, and a gate of the NMOS transistor is coupled to the control signal generator 31 to receive a first control signal BLEQ. Two ends of the sensing amplifier 34 are coupled to the bit lines BL and /BL of the bit line pair. Two source of the PMOS transistors P1 and P2 are coupled to an equalizing voltage $V_{eq}$. Two drains of the PMOS transistors P1 and P2 are respectively coupled to the bit lines BL and /BL of the bit line pair. Two gates of the PMOS transistors P1 and P2 are coupled to the control signal generator 31 to receive a second control signal BLEQB. The bit lines BL and /BL of the bit line pair are coupled to the memory cells 32, 33, and the word lines WL1 and WL2 are respectively coupled to the memory cells 32 and 33.

In the exemplary embodiment, the control signal generator 31 generates a first control signal BLEQ and a second control signal BLEQB, wherein the first control signal BLEQ is used to control two PMOS transistors P1, P2 of the precharge circuit, and the second control signal BLEQB is used to control a NMOS transistor N1 of the precharge circuit. In the standby mode, the first control signal BLEQ is usually at a logic low level, and the second control signal BLEQB is usually at a second logic low level (higher than a first logic low level); and in the active mode, the first control signal BLEQ is usually at a logic low level, and the second control signal BLEQB is usually at a first logic high level. Both in the active and standby mode, the first control signal BLEQ is at the logic high level only when the second control signal BLEQB is at the first logic low level, and the first control signal BLEQ and the second control signal BLEQB respectively maintain the first logic high level and the first logic low level for transient periods which are much shorter than periods of the active and standby modes. Therefore, in the standby mode, the NMOS transistor N1 and the PMOS transistor P2 in the precharge circuit are usually turned off to reduce the standby current; and in the active mode, the transistors N1, P1, and P2 of the precharge circuit are turned on for the transient period before the word line signal WL signal changes from the logic low level to the logic high level. It is noted that, the logic high level can be the first logic high level, the logic low level can be the first or second logic low level, and the present disclosure is not limited thereto.

Figure 4:
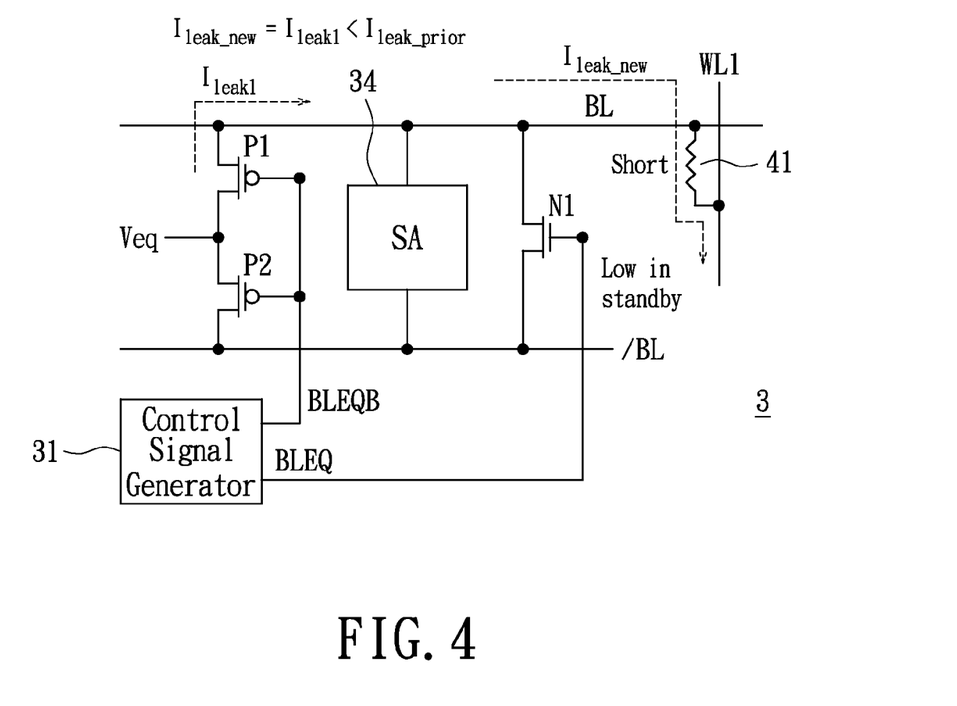
FIG. 4 is an equivalent circuit diagram showing a semiconductor memory device which has a cross-fail according to an exemplary embodiment of the present disclosure.

Further referring to FIG. 4, FIG. 4 is an equivalent circuit diagram showing a semiconductor memory device which has a cross-fail according to an exemplary embodiment of the present disclosure. When the cross-fail occurs at the word line WL1 and the line BL, the bit line/word line short circuiting 41 can be modeled a resistor between the word line WL1 and the bit line BL.

Figure 5:
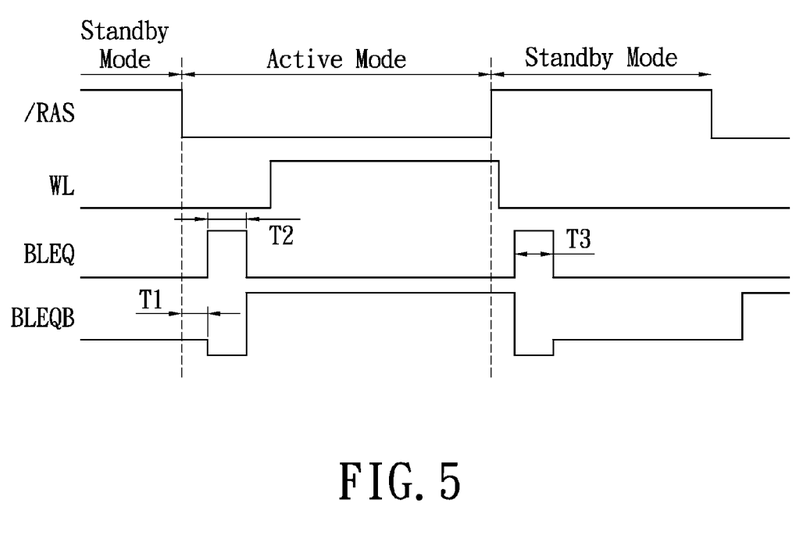
FIG. 5 is a waveform diagram of a row address strobe signal, a word line signal, a first control signal, and a second control signal in the semiconductor memory device of FIG. 4.
Figure 6:
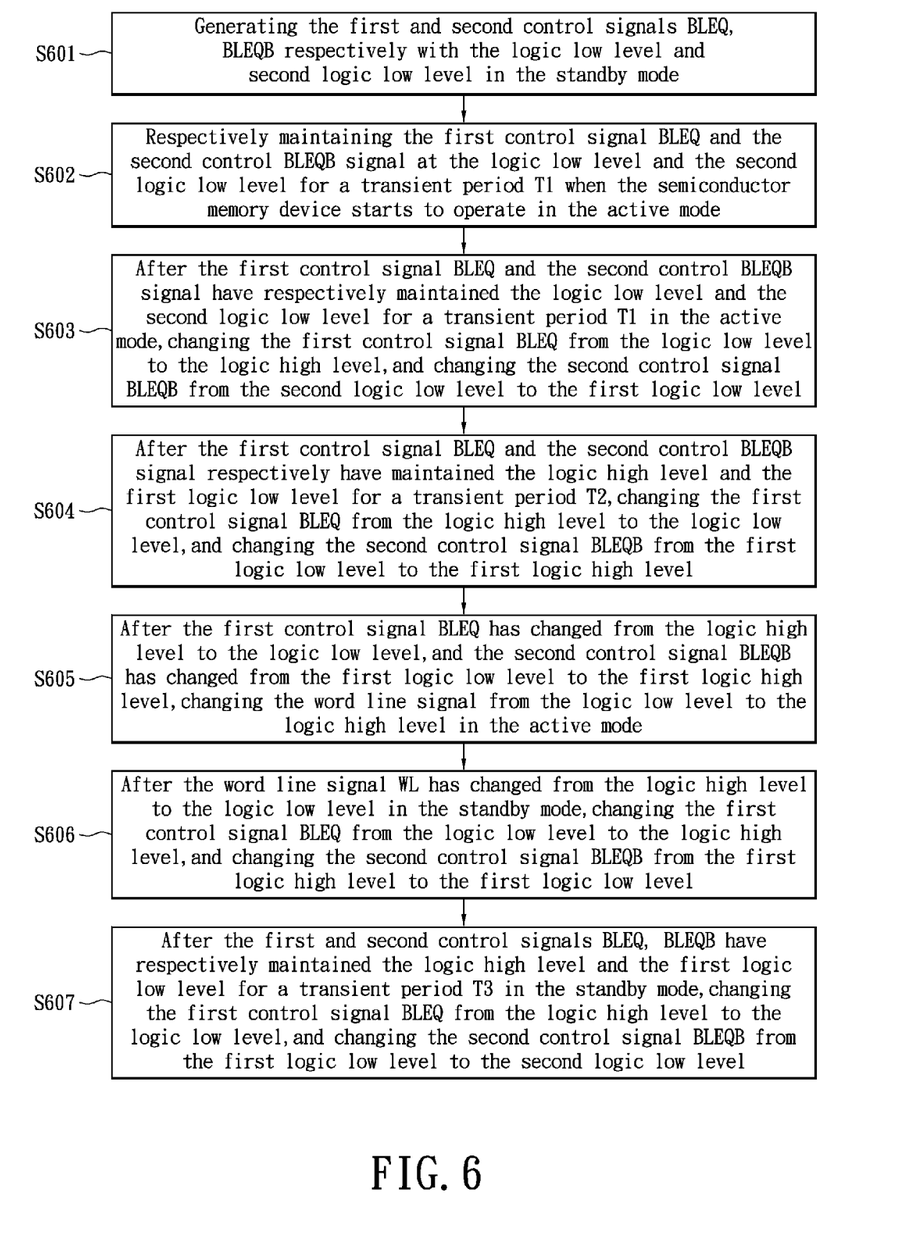
FIG. 6 is a method for reducing a standby current of the semiconductor memory device according to an exemplary embodiment of the present disclosure.

Referring to FIG. 4 through FIG. 6, FIG. 5 is a waveform diagram of a row address strobe signal, a word line signal, a first control signal, and a second control signal in the semiconductor memory device of FIG. 4, and FIG. 6 is a method for reducing a standby current of the semiconductor memory device according to an exemplary embodiment of the present disclosure.

The row address strobe signal /RAS controls the semiconductor memory device 3 to operate in the standby mode or the active mode. The word line signal WL is used to select the corresponding word line, for example the word line WL1. The first and second control signals BLEQ and BLEQB are used to control the precharge circuit to precharge the bit lines BL and /BL of the bit line pair in the standby mode.

Firstly, the row address strobe signal /RAS is at the logic high level, thus the semiconductor memory device 3 operates in the standby mode, and the word line signal WL is at the logic low level. At step S601, the control signal generator 31 generates the first and second control signals BLEQ, BLEQB respectively with the logic low level and second logic low level in the standby mode. The NMOS transistor N1 and the PMOS transistor P2 are turned off, and the PMOS transistor P1 is turned on, thus the standby current $I_{leak\_new}$ passing through the bit line/word line short circuiting 41 is the current $I_{leak1}$ passing through the NMOS transistor N1, and less than the standby current $I_{leak\_prior}$ of the conventional semiconductor memory device 1 of FIG. 1.

Then, the row address strobe signal /RAS changes from the logic high level to the logic low level, so as to controls the semiconductor memory device 3 to operate in the active mode. At step S602, the first control signal BLEQ and the second control BLEQB signal respectively maintain the logic low level and the second logic low level for a transient period T1 when the semiconductor memory device starts to operate in the active mode, wherein the transient period T1 is much shorter than the period of the active mode.

Next, at step S603, after the first control signal BLEQ and the second control BLEQB signal have respectively maintained the logic low level and the second logic low level for a transient period T1 in the active mode, the first control signal BLEQ changes from the logic low level to the logic high level, and the second control signal BLEQB changes from the second logic low level to the first logic low level. At step S604, after the first control signal BLEQ and the second control BLEQB signal respectively have maintained the logic high level and the first logic low level for a transient period T2, the first control signal BLEQ changes from the logic high level to the logic low level, and the second control signal BLEQB changes from the first logic low level to the first logic high level. Thus, the transistors N1, P1, and P2 of the precharge circuit can be turned on for the transient period T2 in the active mode.

At step S605, after the first control signal BLEQ has changed from the logic high level to the logic low level, and the second control signal BLEQB has changed from the first logic low level to the first logic high level, the word line signal changes from the logic low level to the logic high level in the active mode. When the active mode is finished, and the row address strobe signal /RAS changes from the logic low level to the logic high level, such that the semiconductor memory device 3 enters the standby mode again. At step S606, after the word line signal WL has changed from the logic high level to the logic low level in the standby mode, first control signal BLEQ changes from the logic low level to the logic high level, and the second control signal BLEQB changes from the first logic high level to the first logic low level.

At step S607, after the first and second control signals BLEQ, BLEQB have respectively maintained the logic high level and the first logic low level for a transient period T3 in the standby mode, the first control signal BLEQ changes from the logic high level to the logic low level, and the second control signal BLEQB changes from the first logic low level to the second logic low level, wherein the period T3 is much shorter than the period of the standby mode. Meanwhile, the NMOS transistor N1 and the PMOS transistor P2 are turned off, and the PMOS transistor P1 is turned on. Thus, the standby current $I_{leak\_new}$ is usually the current $I_{leak1}$, and smaller than the standby current $I_{leak\_prior}$ of the conventional semiconductor memory device 1 of FIG. 1.

It is noted that, the first control signal BLEQ is a two-phase or three-phase signal, and the second control signal BLEQB is a three-phase signal. The first control signal BLEQ is at the logic high level only when the second control signal BLEQB is at the first logic low level, and the first control signal BLEQ is at the logic low level when the second control signal BLEQB is at the second logic low or first logic high level. In short, the first and second control signals BLEQ, BLEQB are respectively at the logic high and first logic low levels for the transient period T2 in the active mode or the transient period T3 in the standby mode, and thus the standby current $I_{leak\_new}$ of the semiconductor memory device 3 is reduced.

Accordingly, exemplary embodiments of the present disclosure provide a method for reducing the standby current of the semiconductor memory device and a semiconductor memory device thereof. In these exemplary embodiments, the standby current of the semiconductor memory device is smaller than that of the conventional semiconductor memory device.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A method for reducing a standby current of a semiconductor memory device, wherein the semiconductor memory device has a precharge circuit comprising a NMOS transistor and two PMOS transistors, the NMOS transistor is controlled by a second control signal, the two PMOS transistors are controlled by a first control signal, the first control signal and the second control signal are respectively a logic low level and a second logic low level in a standby mode before the semiconductor memory device enters an active mode, and the method comprising:

after the semiconductor memory device enters an active mode from the standby mode, changing the first control signal from the logic low level to a logic high level in the active mode, and changing the second control signal from the second logic low level to a first logic low level in the active mode, wherein the first logic low level is lower than the second logic low level; and before a word line signal changes from the logic low level to the logic high level in the active mode, changing the first control signal from the logic high level to the logic low level in the active mode, and changing the second control signal from the first logic low level to a first logic high level in the active mode.

2. The method according to claim 1, wherein the first control signal is at the logic high level only when the second control signal is at the first logic low level.

3. The method according to claim 2, wherein the first control signal is at the logic low level when the second control signal is at the second logic low or the first logic high level.

4. The method according to claim 1, wherein after the first control signal and the second control signal have respectively maintained the logic low level and the second logic low level for a first transient period in the active mode, changing the first control signal from the logic low level to the logic high level in the active mode, and changing the second control signal from the second logic low level to the first logic low level in the active mode, wherein the first transient period is much smaller than a period of the active mode.

5. The method according to claim 4, wherein after the first and second control signals have respectively maintained the logic high level and the first logic low level for a second transient period in the active mode, changing the first control signal from the logic high level to the logic low level in the active mode, and changing the second control signal from the first logic low level to the first logic high level in the active mode.

6. The method according to claim 1, wherein after the semiconductor memory device enters the standby mode from the active mode, the method further comprising:

after the word line signal has changed from the logic high level to the logic low level in the standby mode, changing the first control signal from the logic low level to the logic high level in the standby mode, and changing the second control signal from the first logic high level to the first logic low level in the standby mode; and after the first control signal and the second control signal have respectively maintained the logic high level and the first logic low level for a third transient period in the standby mode, changing the first control signal from the logic high level to the logic low level in the standby mode, and changing the second control signal from the first logic low level to the second logic low level in the standby mode, wherein the third transient period is much shorter than a period of the standby mode.

7. A semiconductor memory device, comprising:
a plurality of memory cells;
a sensing amplifier;
a precharge circuit, having a NMOS transistor and two PMOS transistors, for precharging bit lines of a bit line pair, wherein the NMOS transistor is controlled by a first control signal, and the two PMOS transistors are controlled by a second control signal; and a control signal generator, for generating the first and second control signals, wherein the first control signal is at a logic high level only when the second control signal is at a first logic low level, the first control signal is at a logic low level when the second control signal is at a second logic low or a first logic high level, and the second logic low level is higher than the first logic low level.

8. The semiconductor memory device according to claim 7, wherein the first control signal and the second control signal are respectively the logic low level and a second logic low level in a standby mode before the semiconductor memory device enters an active mode; after the semiconductor memory device enters an active mode from the standby mode, the control signal generator changes the first control signal from the logic low level to the logic high level in the active mode, and changes the second control signal from the second logic low level to the first logic low level in the active mode, wherein the first logic low level is lower than the second logic low level; before a word line signal changes from the logic low level to the logic high level in the active mode, the control signal generator changes the first control signal from the logic high level to the logic low level in the active mode, and changes the second control signal from the first logic low level to the first logic high level in the active mode.

9. The semiconductor memory device according to claim 8, wherein after the first control signal and the second control signal have respectively maintained the logic low level and the second logic low level for a first transient period in the active mode, the control signal generator changes the first control signal from the logic low level to the logic high level in the active mode, and changes the second control signal from the second logic low level to the first logic low level in the active mode, wherein the first transient period is much smaller than a period of the active mode.

10. The semiconductor memory device according to claim 9, wherein after the first and second control signals have respectively maintained the logic high level and the first logic low level for a second transient period in the active mode, the control signal generator changes the first control signal from the logic high level to the logic low level in the active mode, and changes the second control signal from the first logic low level to a first logic high level in the active mode.

11. The semiconductor memory device according to claim 9, wherein when the semiconductor memory device finishes the active mode, the semiconductor memory device enters the standby mode from the active mode; after the word line signal has changed from the logic high level to the logic low level in the standby mode, the control signal generator changes the first control signal from the logic low level to the logic high level in the standby mode, and changes the second control signal from the first logic high level to the first logic low level in the standby mode; after the first control signal and the second control signal have respectively maintained the logic high level and the first logic low level for a third transient period in the standby mode, the control signal generator changes the first control signal from the logic high level to the logic low level in the standby mode, and changes the second control signal from the first logic low level to the second logic low level in the standby mode, wherein the third transient period is much shorter than a period of the standby mode.

* * * * *